United States Patent [19]
Kwon et al.

[11] Patent Number: 5,926,702
[45] Date of Patent: Jul. 20, 1999

[54] METHOD OF FABRICATING TFT ARRAY SUBSTRATE

[75] Inventors: Byung-Ik Kwon, Kumi-si; Byeong-Koo Kim, Yiwang-si; Jeong-Hyun Kim, Anyang-si; Kyoung-Nam Lim, Seoul; Soo-Mahn Kim, Anyang-si; Kyeong-Ah Shin, Kunpo-si, all of Rep. of Korea

[73] Assignee: LG Electronics, Inc., Seoul, Rep. of Korea

[21] Appl. No.: 08/901,676

[22] Filed: Jul. 28, 1997

Related U.S. Application Data

[62] Division of application No. 08/803,382, Feb. 20, 1997, Pat. No. 5,866,919.

[30] Foreign Application Priority Data

Apr. 16, 1996 [KR] Rep. of Korea ............ 96-11378
Apr. 16, 1996 [KR] Rep. of Korea ............ 96-11379

[51] Int. Cl.$^6$ .................... H01L 29/04; G02F 1/136
[52] U.S. Cl. .................. 438/158; 438/151; 438/149; 349/42; 349/44; 349/106; 349/111
[58] Field of Search .................... 438/158, 151, 438/149; 349/42, 44, 106, 111; 359/57, 59

[56] References Cited

U.S. PATENT DOCUMENTS

| | | |
|---|---|---|
| 4,636,038 | 1/1987 | Kitahara et al. ............ 350/339 |
| 5,229,644 | 7/1993 | Wakai et al. ............ 257/749 |
| 5,641,974 | 6/1997 | Boer et al. ............ 257/59 |
| 5,742,365 | 4/1998 | Seo . |
| 5,751,381 | 5/1998 | Ono et al. . |
| 5,781,254 | 7/1998 | Kim et al. . |
| 5,784,133 | 7/1998 | Kim et al. . |
| 5,798,744 | 7/1995 | Tanaka et al. . |
| 5,850,271 | 12/1998 | Kim et al. . |
| 5,851,411 | 12/1998 | An et al. . |
| 5,852,485 | 12/1998 | Shimada et al. . |
| 5,854,663 | 12/1998 | Oh et al. . |

FOREIGN PATENT DOCUMENTS

| | | |
|---|---|---|
| 60-17422 | 1/1985 | Japan . |
| 63-279228 | 11/1988 | Japan . |
| 63-289955 | 11/1988 | Japan . |
| 1-124824 | 5/1989 | Japan . |
| 4-68318 | 3/1992 | Japan . |
| 4-163528 | 6/1992 | Japan . |
| 4-253028 | 9/1992 | Japan . |
| 7-72473 | 3/1995 | Japan . |
| 8-15727 | 1/1996 | Japan . |

OTHER PUBLICATIONS

Toshihara UEKI et al., *Dye embedded BM resin and three dimensional picture element implemented by BM on Array technology for the first time*, Nikkei Microdevices, 60–62 (Jul. 1994).

M.J. Radler et al., *Cyclotene™ Advanced Electronics Resins for High–Aperture AMLCD Applications*, SID 96 Applications Digest, pp. 33–36 (1996).

D.J. Perettie et al., *Benzocyclobutene as a Planarization Overcoat for Flat Panel Displays*, Asia Display '95, pp. 721–724 (1995).

Koji Kishimoto, *Low–dielectric–constant interlayer insulating film and its manufacturing method*, Electronic Journal, pp. 33–35 (Mar. 1996).

Toshihara Ueki et al., *Dye embedded BM resin and three dimensional picture element implemented by BM on Array technology for the first time*, Nikkei Microdevices, pp. 60–62 (Jul. 1994).

*Primary Examiner*—Charles Bowers
*Assistant Examiner*—Martin Sulsky
*Attorney, Agent, or Firm*—Morgan, Lewis & Bockius LLP

[57] ABSTRACT

An LCD includes a substrate; a transistor over the substrate, the transistor having a gate, a source, and a drain; a light shielding layer over the transistor; a transparent insulating layer at sides of the light shielding layer, the transparent insulating layer having a substantially consistent thickness; and a pixel electrode connected to one of the source and the drain of the transistor.

19 Claims, 11 Drawing Sheets

METHOD OF FABRICATING TFT ARRAY SUBSTRATE

This is a divisional of application Ser. No. 08/803,382 filed on Feb. 20, 1997 now U.S. Pat No. 5,866,919.

BACKGROUND OF THE INVENTION

1. Field of the Invention

The present invention relates to a thin film transistor (TFT) array substrate for a liquid crystal display, and more particularly, to a TFT array substrate having a black matrix and its fabrication method 2. Discussion of the Related Art FIG. 1A is a plan view showing the structure of a TFT array substrate (lower substrate) for a conventional TFT liquid crystal display.

Pixels are arranged in a matrix on the lower substrate. Each pixel has a pixel electrode 17 connected to the TFT, a switching device, and a drain electrode 11D of the TFT. A gate bus line (gate bus) 13L formed in one direction is connected to a gate electrode 13G of the TFT formed at each pixel. A data bus line (data line) 11L formed in the direction crossing the gate bus line is connected to a source electrode 11S of the TFT.

On another substrate (upper substrate, not shown), there is provided a black matrix (light shielding layer) for shielding an opaque portion of the lower substrate and a portion which causes light leakage. In FIG. 1A, dotted lines 21 represent the black matrix pattern projected onto the lower substrate from the upper substrate.

FIGS. 1B and 1C are cross-sectional views of the upper and lower substrates of the liquid crystal display taken along lines I—I and II—II in FIG. 1A, respectively. These figures show the portion near the data bus line and the portion near the TFT, respectively.

Referring to FIG. 1C a gate electrode 13G made of a metal is formed on the lower substrate 10. An island-shaped active layer 15 of a semiconductor material is formed over the gate electrode 13G together with a gate insulating layer 12 over the substrate. An ohmic contact layer 14 of a doped semiconductor material is formed on the active layer 15. A source electrode 11S and a drain electrode 11D are formed on the ohmic contact layer 14. The source electrode 11S extends to a data bus line 11L formed on the gate insulating layer 12. A protective layer 16 is formed on the data bus line 11L, source electrode 11S, drain electrode 11D, the exposed portion of the active layer 15, and the exposed portion of the gate insulating layer 12. A pixel electrode 17 connected to the drain electrode 11D via a contact hole formed in the protective layer 16 is formed on the protective layer 16. The top layer above the pixel electrode 17 is an orientation layer 19.

On an upper substrate 20, a black matrix 21 is formed to shield the TFT, the data bus line 11, and the gate bus line 13L of the lower substrate 10. Here, the black matrix 21 is formed in consideration of the margin at the attachment area of the upper and lower substrates and for preventing light leakage at the margin. Besides the black matrix 21, a color filter 22, a common voltage electrode 23, and an orientation layer 24 are formed on the upper substrate 20, respectively.

In the conventional liquid crystal display, the black matrix is formed on the upper substrate. Thus, the margin for misalignment in the attachment of the upper and lower substrates must be considered. As a result, the size of the black matrix must be large, which makes the aperture ratio of the liquid crystal display to be small. In addition, because the black matrix is made of a metal such as chrome, a parasitic capacitance problem due to its conductivity and a light reflection problem due to its high reflection coefficient exist.

FIGS. 2A and 2B show an alternative technique in which the black matrix is formed on the lower substrate in order to solve the above problem concerning the aperture ratio. Here, the black matrix is made of an opaque insulating resin, thus solving the light reflection and the parasite capacitance problems caused by using a black matrix made of a metal.

As shown in FIG. 2B, the substrate has a gate electrode 13G, a gate insulating layer 12, and an active layer 15. The active layer 15 is formed on the gate insulating layer 12 so as to cover the gate electrode 13G. An ohmic contact layer 14 is formed on the active layer 15. A pixel electrode 17 is formed to be spaced from the ohmic contact layer 14 and the active layer 15 by predetermined distances. A source electrode 11S and a drain electrode 11D are formed to be in contact with the ohmic contact layer 14. Here, the source electrode 11S is connected to the data bus line 11, as shown in FIG. 2B. The drain electrode 11D is connected to the pixel electrode 17. A protective layer 16 is formed under the pixel electrode 17 and over the source electrode 11S and the drain electrode 1D. A black matrix 18 of an opaque insulating resin is formed on an area between the two adjacent pixel electrodes 17.

In the first conventional technique above, the black matrix is formed of a metal such as chrome. However, in the second conventional technique just described above, the black matrix 18 is formed of an opaque insulating resin. Therefore, the parasitic capacitance between the black matrix made and source and drain electrodes is eliminated. In addition, the black matrix of a resin has a lower reflection coefficient than that of a metal, solving the light reflection problem.

However, when the black matrix is formed of such a resin, because of its poor light shielding capability, the black matrix must be formed as thick as 1–2 $\mu$m. This results in the formation of high steps near the boundary between the black matrix and the pixel electrode. These steps cause a poor rubbing problem in that the orientation layer 19 made of polyamide or polyimide near the step can not be properly rubbed due to the steps created by the large thickness of the resin. Thus, liquid crystal placed on the poorly rubbed orientation layer is not properly oriented in a desired direction or arranged at a desired angle when a signal voltage is applied.

SUMMARY OF THE INVENTION

Accordingly, the present invention is directed to a TFT array substrate and its fabrication method that substantially obviate one or more of the problems due to limitations and disadvantages of the related art.

An object of the present invention is to provide a TFT array substrate which prevents poor rubbing problem and the method for fabricating the same.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, there is provided a thin-film-transistor (TFT) array substrate including a substrate; at least one gate bus line formed on the substrate; at least one data bus line formed to intersect with the gate bus line; at least one TFT whose gate electrode is coupled to the gate bus line, and whose source electrode is coupled to the data bus line; a black matrix resin formed to cover the data bus line, gate bus line and TFT; a transparent planarization layer patterned on the overall surface of the substrate excluding the black matrix resin; and a pixel electrode covering part of the black matrix resin and transparent planarization layer, the pixel electrode being connected to a drain electrode of the TFT.

In another aspect of the present invention, there is provided a thin-film-transistor (TFT) array substrate including a substrate; at least one gate bus line formed on the substrate; at least one data bus line formed to intersect with the gate bus line; at least one TFT whose gate electrode is coupled to the gate bus line, and whose source electrode is coupled to the data bus line; a pixel electrode connected to a drain electrode of the TFT and formed between the intersection of the gate bus line and data bus line; a black matrix resin formed of opaque insulating resin to cover the data bus line, gate bus line and TFT; and a transparent planarization layer patterned on the overall surface of the substrate excluding the black matrix resin.

In another aspect, there is provided a method of fabricating a thin-film-transistor (TFT) array substrate, the method including the steps of: (a) forming a TFT arranged in matrix on part of a substrate, a gate bus line coupled to a gate electrode of the TFT, and a data bus line intersected with the gate bus line and coupled to a source electrode of the TFT; (b) coating opaque insulating resin over the exposed substrate, and patterning the opaque insulating resin to remain on the TFT excluding the drain electrode of the TFT, and on the data bus line and gate bus line, to thereby form a black matrix resin; (c) coating a color resist over the black matrix resin and the exposed substrate, and patterning the resultant structure to thereby form a transparent planarization layer above the black matrix resin and on a region where the drain electrode is exposed; and (d) stacking a transparent conductive material on the transparent planarization layer and on the exposed surface of the black matrix resin, and forming a pixel electrode coupled to the drain electrode.

In another aspect, there is provided a method of fabricating a thin-film-transistor (TFT) array substrate, the method including the steps of: (a) forming a TFT arranged in matrix on part of a substrate, a gate bus line coupled to a gate electrode of the TFT, a data bus line intersected with the gate bus line and coupled to a source electrode of the TFT, and a pixel electrode coupled to a drain electrode of the TFT; (b) stacking an insulating layer on the TFT and pixel electrode to thereby form a protective layer; (c) forming a black matrix resin of opaque insulating resin to thereby cover the TFT, data bus line and gate bus line; and (d) forming a transparent planarization layer of transparent insulating resin to thereby cover the pixel electrode exposed from said black matrix.

In another aspect of the present invention, an LCD includes a substrate; a transistor over the substrate, the transistor having a gate, a source, and a drain; a light shielding layer over the transistor; a transparent insulating layer at sides of the light shielding layer, the transparent insulating layer having a substantially consistent thickness; and a pixel electrode connected to one of the source and the drain of the transistor, wherein an upper surface of the light shielding layer and an upper surface of the transparent insulating layer are at a substantially same level.

In another aspect of the present invention, an LCD having a transistor includes a substrate; a gate line over the substrate; a light shielding layer over the gate line; a transparent insulating layer at sides of the light shielding layer, the transparent insulating layer having a substantially consistent thickness; and a pixel electrode over the transparent insulating layer, wherein an upper surface of the light shielding layer and an upper surface of the transparent insulating layer are at a substantially same level.

In another aspect of the present invention, an LCD having a transistor includes a substrate; a data line over the substrate; a light shielding layer over the data line; a transparent insulating layer at sides of the light shielding layer, the to transparent insulating layer having a substantially consistent thickness; and a pixel electrode over the transparent insulating layer, wherein an upper surface of the light shielding layer and an upper surface of the transparent insulating layer are at a substantially same level.

In another aspect of the present invention, an LCD includes a substrate; a transistor over the substrate, the transistor having a gate, a source, and a drain; a gate line over the substrate connected to the gate of the transistor; a data line over the substrate connected to one of the drain and source of the transistor; a light shielding layer over the transistor, the gate line, and the data line; a transparent insulating layer at sides of the light shielding layer, the transparent insulating layer having a substantially consistent thickness; and a pixel electrode over the transparent insulating layer, the pixel electrode being connected to one of the source and the drain of the transistor, wherein an upper surface of the light shielding layer and an upper surface of the transparent insulating layer are at a substantially same level.

In another aspect of the present invention, a method of fabricating an LCD having a substrate includes the steps of forming a transistor having a gate, a source, and a drain over the substrate; forming a light shielding layer over the thin film transistor; forming a transparent insulating layer at sides of the light shielding layer; and forming a pixel electrode connected to one of the source and the drain of the transistor, wherein the transparent insulating layer is formed to have an upper surface at a substantially same level as an upper surface of the light shielding layer.

In a further aspect of the present invention, a method of fabricating an LCD having a substrate includes the steps of forming a transistor having a gate, a source, and a drain over the substrate; forming a pixel electrode connected to one of the source and the drain of the transistor; forming a protective layer over the transistor and the pixel electrode; forming a light shielding layer over the thin film transistor; and forming a transparent insulating layer at sides of the light shielding layer over the pixel electrode.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENTS

Reference will now be made in detail to the preferred embodiments of the present invention, examples of which are illustrated in the accompanying drawings.

Figure 1A:
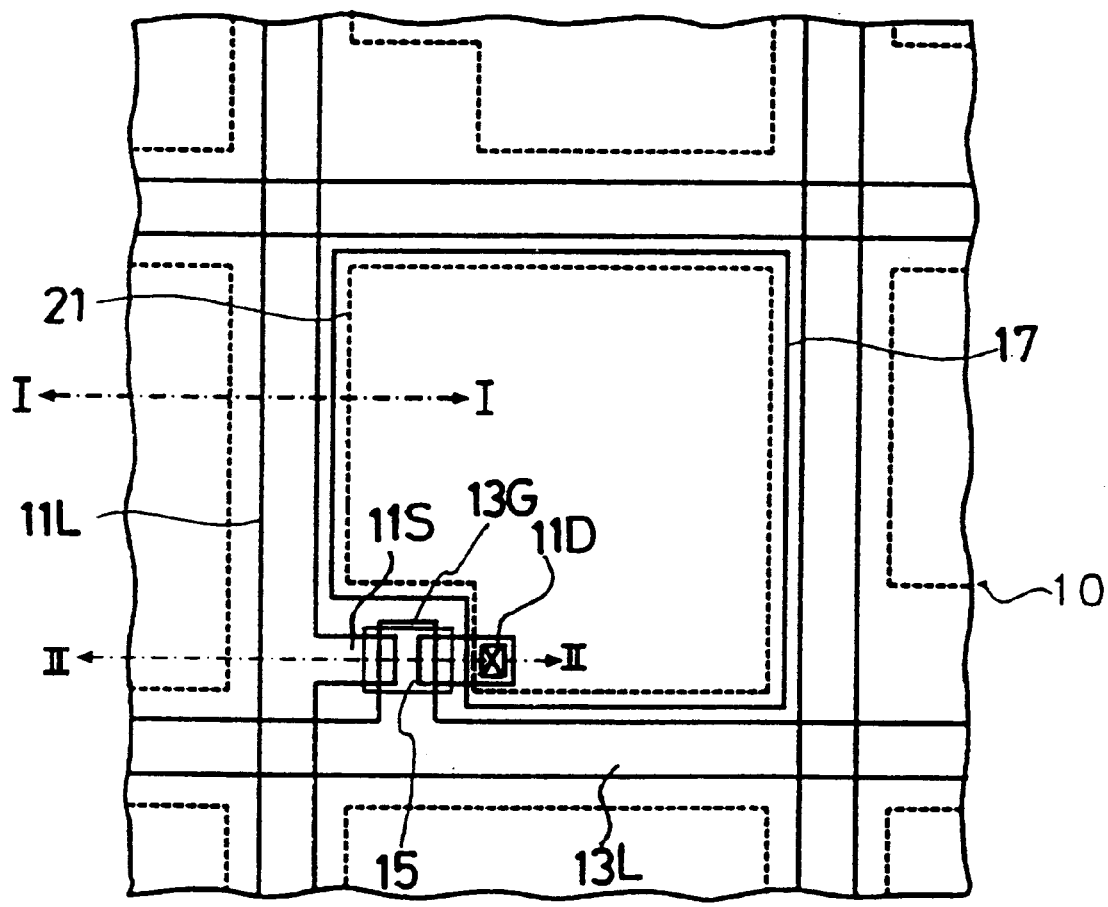
FIGS. 1A, 1B and 1C illustrate a conventional liquid crystal display.
Figure 1B:
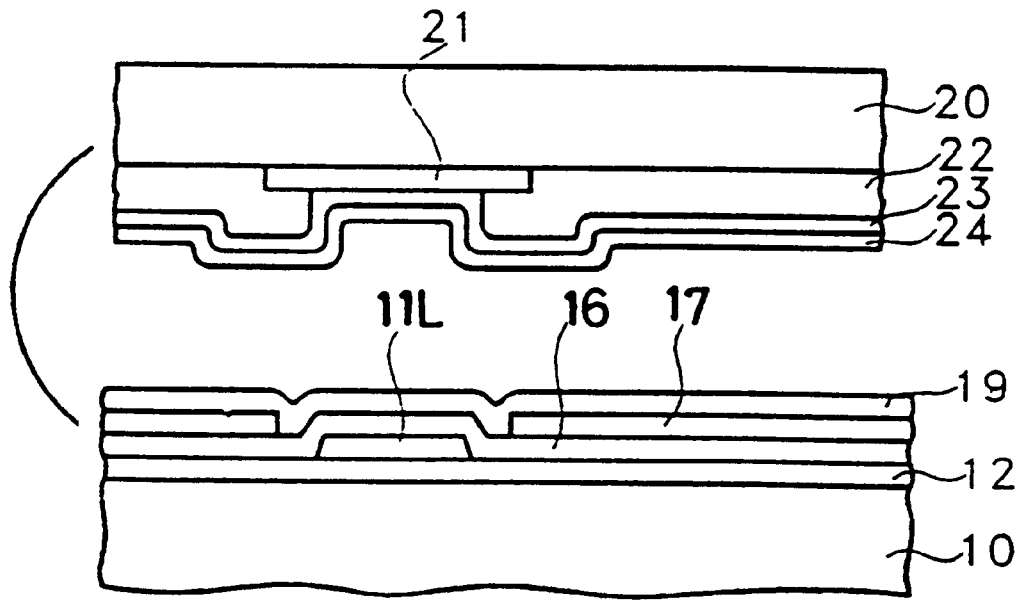
Figure 1C:
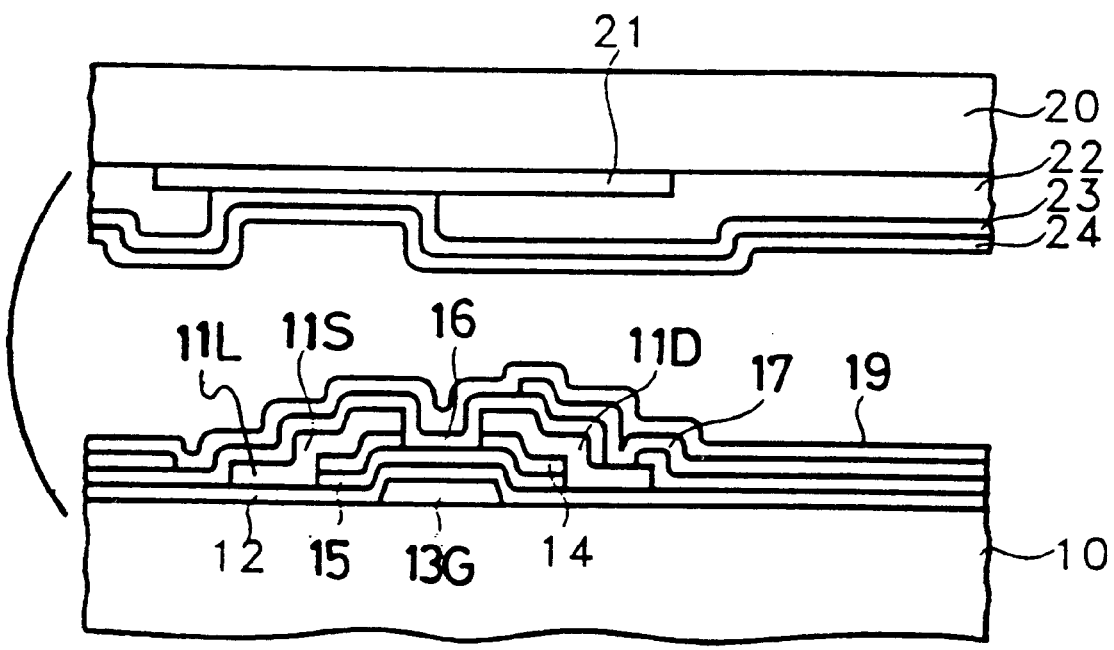
Figure 2A:
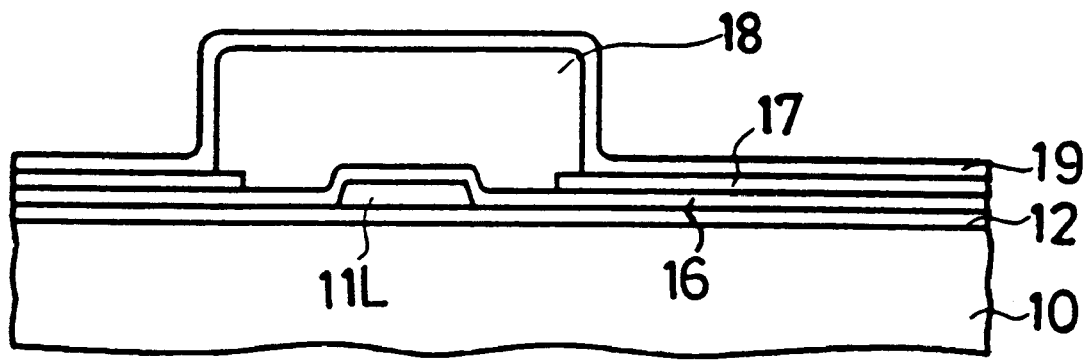
FIGS. 2A and 2B illustrate another conventional liquid crystal display.
Figure 2B:
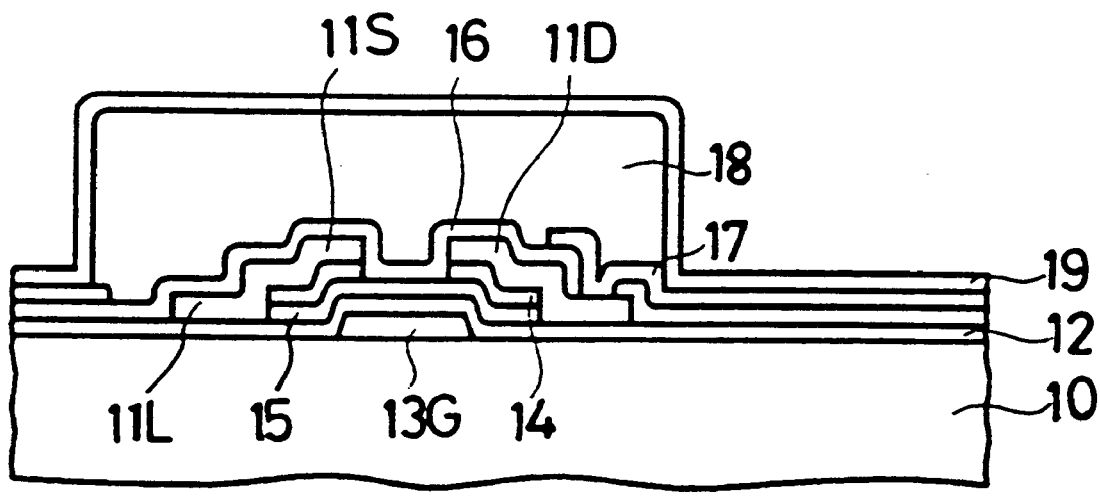
Figure 3A:
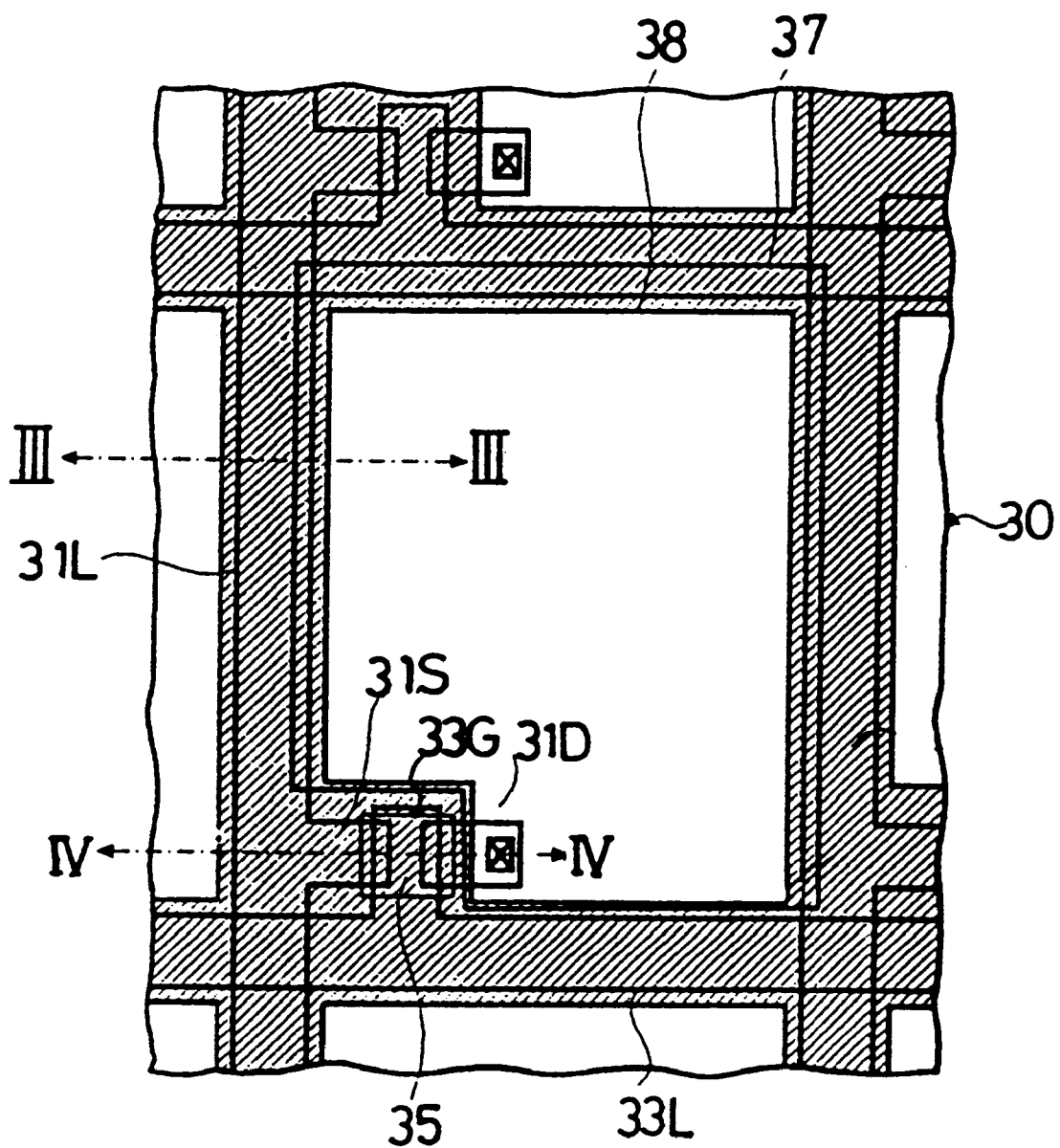
FIGS. 3A, 3B and 3C illustrate a TFT array substrate according to a first embodiment of the present invention.
Figure 3B:
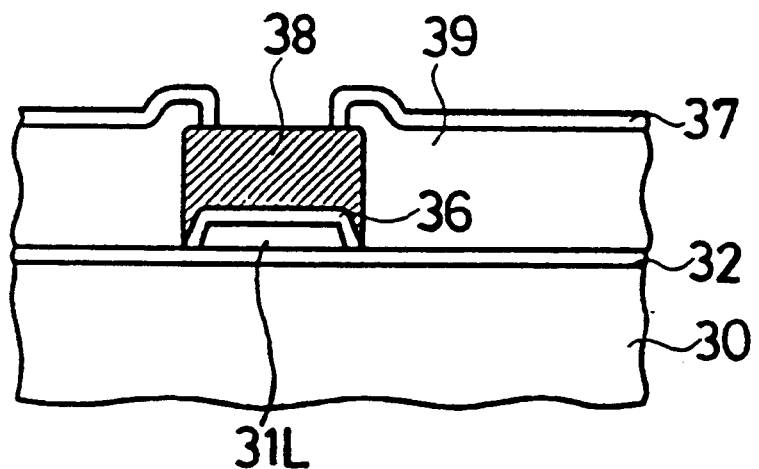
Figure 3C:
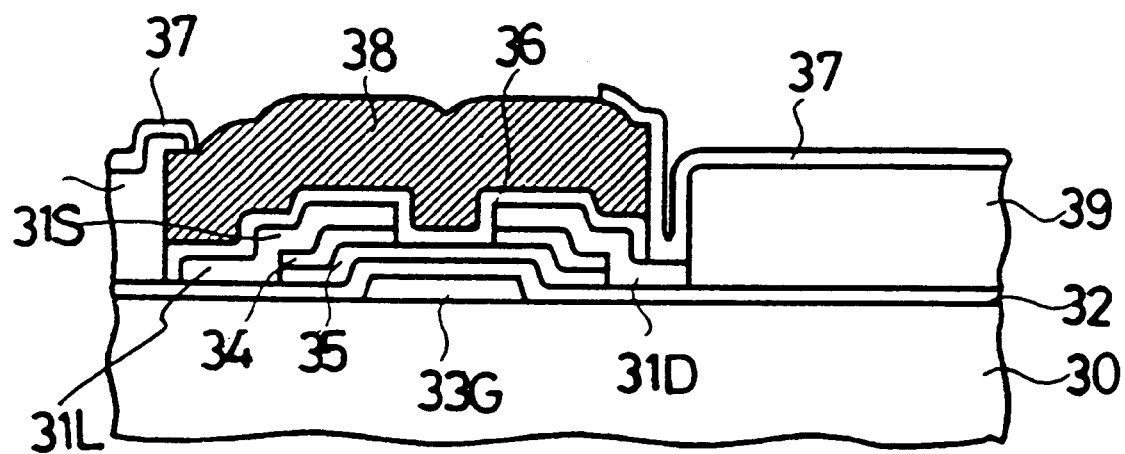

Referring to FIGS. 3A to 3C, a first embodiment of the present invention will be described. FIG. 3A is a plan view showing the structure of a pixel. A gate bus line (gate line) 33L and a data bus line (data line) 31L that cross each other are formed on a substrate 30. A pixel electrode 37 is formed on the area surrounded by the gate bus line 33L and the data bus line 31L. A gate electrode 33G protrudes from the gate bus line 33L. A source electrode 31S protrudes from the data bus line 31L. Also, a drain electrode 31D is formed in the pixel and connected to the pixel electrode 37.

The pixel electrode 37 is formed in such a way as to minimize its overlap with the gate bus line 33L, and preferably to not overlap with it at all. The reason for this is to minimize the parasitic capacitance between two conductive layers where the gate bus line 33L overlaps the pixel electrode 37. As shown in FIG. 3A, this pixel electrode 37 can, however, overlap a front (or rear) gate bus line 33L, acting as an electrode for a storage capacitor. As will be described below in detail, an insulating layer such as a black matrix resin 38(light shielding layer) is formed 1–2 μm thick between the data bus line 31L and the pixel electrode 37 so that the parasite capacitance between the two metal layers can be minimized. Therefore, the pixel electrode 37 can be superposed more on the data bus line 31L, as compared to the conventional techniques.

The black matrix resin 38 (light shielding layer) is formed on the gate bus line 33L, the data bus line 31L, and the TFT. Here, the area occupied by the black matrix resin 38 can be minimized as compared to the prior art, because the pixel electrode 37 is wide enough to eliminate light leakage. Although not shown in FIG. 3A, a transparent planarization layer (transparent insulating layer) 39, whose boundary is defined by the black matrix resin 38, is formed beneath the pixel electrode 37. The transparent planarization layer 39 is formed in consideration of the thickness of the black matrix resin 38 for planarizing the surface of the substrate (for smoothing the surface profile of the substrate).

FIGS. 3B and 3C are cross-sectional views of the substrate taken along lines III—III and IV—IV of FIG. 3A. These figures show the portion near the data bus line (FIG. 3B) and the portion near the TFT, respectively (FIG. 3C).

A gate electrode 33G of a metal such as chrome or aluminum is formed on the substrate 30. The gate electrode 33G protrudes from the gate bus line 33L. A gate insulating layer 32 of silicon nitride or silicon oxide is provided on the entire exposed surface of the substrate including the gate electrode 33G. An active layer 35 of a semiconductor material such as amorphous silicon is formed on the gate insulating layer 32 so as to cover the gate electrode 33G. An ohmic contact layer 34 of a semiconductor material such as impurity-doped amorphous silicon is formed on the active layer 35. A source electrode 31S and a drain electrode 31D, both made of a metal such as chrome, are formed to be in contact with the ohmic contact layer 34 and cover a portion of the gate insulating layer 32 which is not covered by the ohmic contact layer 34 or by the active layer 35.

Here, the source electrode 31S is connected to the data bus line 31L. A protective layer 36 made of silicon nitride is formed on the gate bus line 33L, the data bus line 31L, and the TFT, as an insulating layer. A black matrix resin 38 of an opaque insulating resin is formed thereon as thick as 1–2 μm in the same pattern as the protective layer 36. A transparent planarization layer 39 of a transparent insulating resin is formed as thick as 1–2 μm at the side of the black matrix resin 38. The transparent planarization layer 39 is preferably made of an organic resin having negative photosensitive characteristics. This is because, if so, the transparent insulating layer can be patterned by applying back exposure without a separate mask.

A contact hole is formed near the boundary between the black matrix resin 38 and the transparent planarization layer 39 over the drain electrode 31D of the TFT. A pixel electrode 37 is formed on planarization layer 39, using a transparent conductive material such as ITO. The pixel electrode 37 is in contact with the drain electrode 31D via the contact hole. Here, the pixel electrode 37 extends to a portion of the black matrix resin 38.

In the first embodiment shown in FIGS. 3A, 3B, and 3C, the protective layer 36 is formed on the TFT and the bus lines, and the black matrix resin 38 is formed on the protective layer 36. This protective layer 36 may be omitted because it serves to prevent the diffusion of impurities contained in the opaque insulating resin forming the black matrix resin 38. In particular, if a TFT has an etch stop for protecting the top of the active layer between the source and drain electrodes (a different structure from that shown in FIG. 3C), the etch stop can prevent the impurity diffusion from the black matrix resin. For this reason, the protective layer may not be necessary. Also, the protective layer may be formed beneath the transparent planarization layer on which the pixel electrode is formed. This may yield a better effect on the planarization in the following process.

Figure 4A:
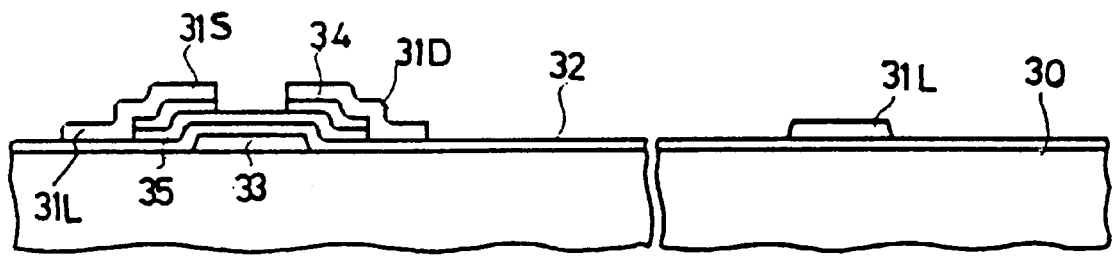
FIGS. 4A–4E are cross-sectional views illustrating the manufacturing process of the TFT array substrate according to the first embodiment of the present invention.

Referring to FIG. 4A, a TFT is formed at each pixel. A gate bus line (not shown) is formed of a metal such as chrome or aluminum on a portion of substrate 30. A data bus line 31L is formed of a metal such as chrome and crosses the gate bus line perpendicularly. A gate electrode 33G is connected to the gate bus line and made of the same material as the gate bus line. A gate insulating layer 32 is formed of an insulating material such as silicon nitride or silicon oxide on the gate electrode 33G and the overall exposed surface of the substrate. An island-shaped active layer 35 of a material such as amorphous silicon is formed to cover the gate electrode 33G. An ohmic contact layer 34 is formed of a semiconductor material such as an impurity-doped amorphous silicon. A drain electrode 31D is formed of the same or different metal from that of source electrode 31S and in contact with a part of the ohmic contact layer 34. The source electrode 31S is in contact with the other part of the ohmic contact layer 34.

Figure 4B:
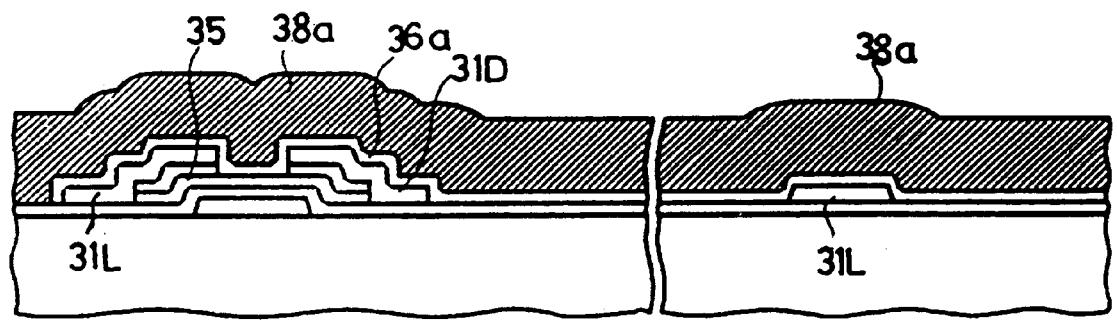

As shown in FIG. 4B, an insulating layer 36a as a protective layer is formed by, for example, chemical vapor deposition (CVD) on the overall surface of the substrate including the TFT, the data bus line 31L, and the gate bus line (not shown). The insulating layer 36a is formed of a material such as silicon nitride or silicon oxide. An electrically insulating opaque organic resin 1–2 μm thick is coated over the substrate, forming a resin layer 38a for the black matrix.

Figure 4C:
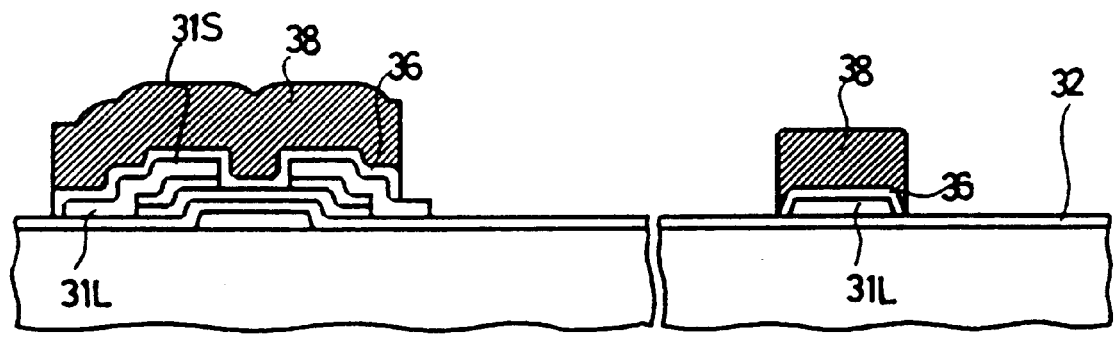

As shown in FIG. 4C, the resin layer 38a for the black matrix and the insulating layer 36a for the protective layer are selectively etched using photolithography. They are left only at the vicinity of the gate bus line, data bus line 31L, and the TFT, thereby forming a black matrix resin 38 and a protective layer 36.

Alternatively, the resin layer 38a for the black matrix shown in FIG. 4B may be formed of a material having positive photosensitive characteristics and exposed by, for example, an ultraviolet ray or a laser beam from the back of the substrate to thereby form the black matrix resin 38 and the protective layer 36. This alternative embodiment is possible because an opaque material layer of a metal is located beneath the areas where the black matrix resin 38 and the protective layer 36 are to be formed. In this case, unlike the structure shown in FIG. 4C, the black matrix resin 38 covers an entire surface of the drain electrode 31D of the TFT.

Figure 4D:
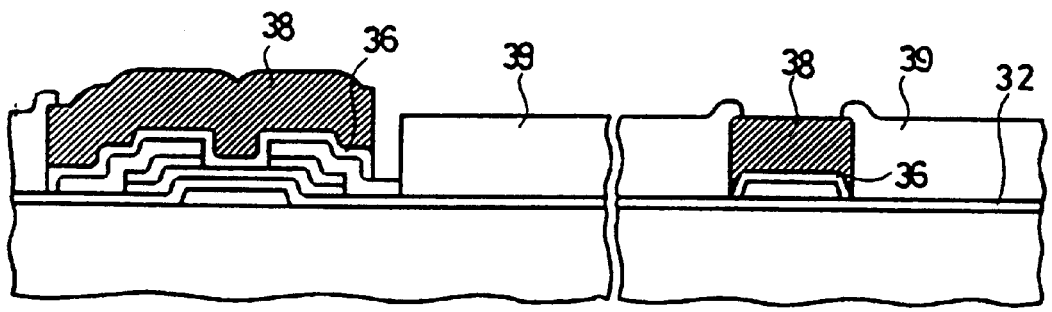

Referring to FIG. 4D, an electrically insulating transparent organic resin having negative photosensitive characteristics is coated on the overall surface of the substrate, and then exposed by an ultraviolet ray or a laser beam from the back of the substrate. By doing so, a transparent planarization layer 39 is formed. The transparent planarization layer 39 is formed as thick as the black matrix resin 38, e.g., 1–2 μm thick, for a better planarization effect, and overcoming the poor rubbing problem. Next, a contact hole is formed over the drain electrode 31D near the boundary between the transparent planarization layer 39 and the black matrix resin 38/protective layer 36. The contact hole is formed such that the transparent planarization layer 39 does not cover the exposed portion of the drain electrode 31D.

Figure 4E:
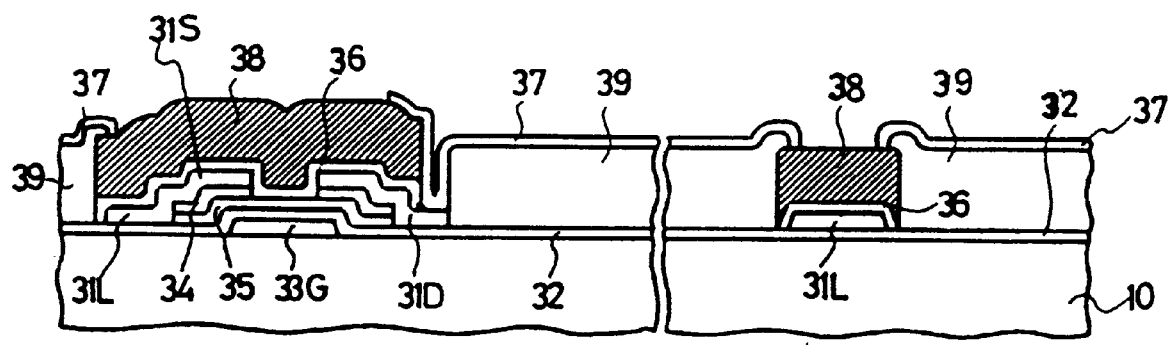

Referring to FIG. 4E, a transparent conductive material such as indium tin oxide is deposited in the contact hole and on the overall surface of the substrate, and patterned to form a pixel electrode 37 using photolithography. Here, the pixel electrode 37 overlaps a portion of the black matrix resin 39 so as to prevent light leakage. As in FIG. 3A, the degree of the overlap between the black matrix resin 38 and the adjacent front or rear gate bus line may be increased to form a larger storage capacitor.

In FIG. 4D, the transparent planarization layer 39 is formed by a self-alignment method through back exposure, using an organic resin having negative photosensitive characteristics. Alternatively, the planarization layer may be formed through photolithography, using transparent organic resin having positive photosensitive characteristics.

In FIG. 4B, as an alternative method, the step of forming the insulating layer 36a for the protective layer prior to the formation of the resin layer 38a for the black matrix may be omitted. In this case, a resin layer 38a for the black matrix is coated on the surface of the substrate including the gate bus line, the data bus line, and the TFT, and patterned to form the black matrix resin 38. Thus, the black matrix resin 38 is in direct contact with the active layer 35 of the TFT. Impurities in the black matrix resin 38 may diffuse into the active layer 35 and change the channel characteristics of the TFT. However, this problem can be solved by an etch stop on the active layer.

Also, the protective layer 36 may be formed to cover the entire surface of the substrate. For example, when the resin layer 38a for the black matrix 38 is patterned in FIG. 4C, the step of patterning the insulating layer 36a can be omitted. In this case, the planarization effect can be improved.

Figure 5A:
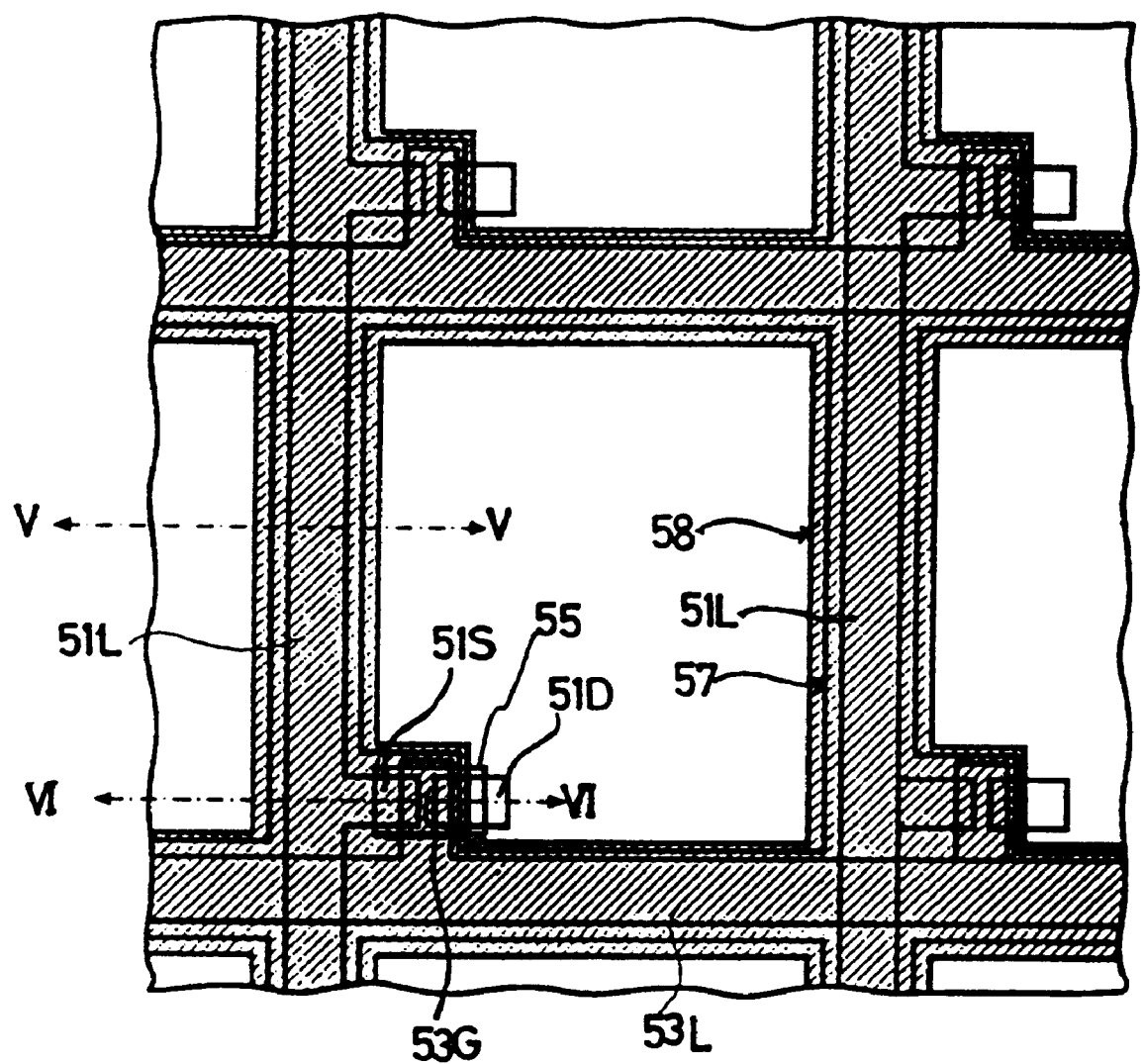
FIGS. 5A, 5B and 5C illustrate a TFT array substrate according to a second embodiment of the present invention.
Figure 5B:
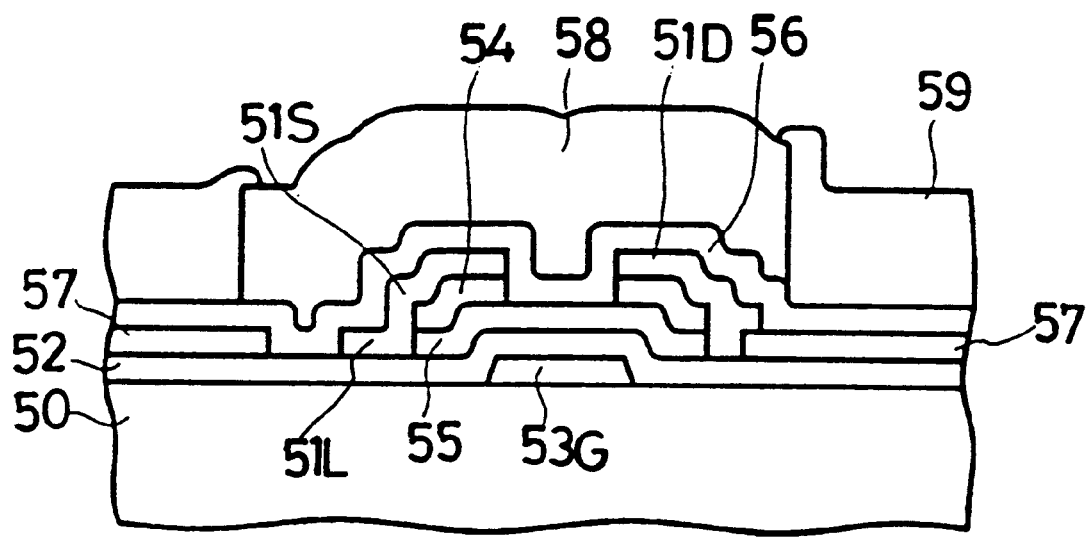
Figure 5C:
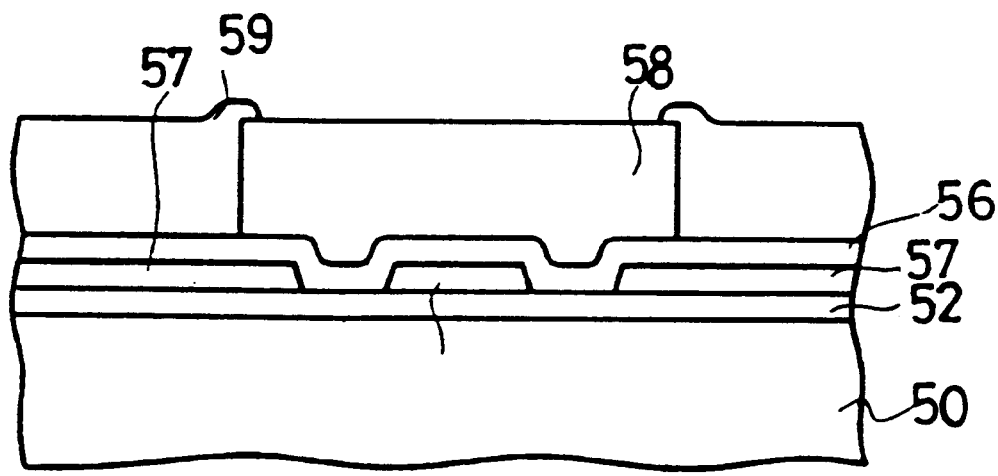

Referring now to FIGS. 5A–5C and 6A–6E, a second embodiment of the present invention will be described. FIG. 5A is a plan view of the second embodiment of the TFT array substrate. FIG. 5B is a cross-sectional view of the TFT area taken alone line V—V of FIG. 5A. FIG. 5C is a cross-sectional view of the data bus line area taken along line VI—VI of FIG. 5A.

As shown in FIG. 5A, a gate bus line 53L crosses a data bus line 51L perpendicularly. A TFT is formed at their intersection. The TFT has a gate electrode 53G extending from the gate bus line 53L, a source electrode 51S extending from the data bus line 51L, and a drain electrode 51D. An area surrounded by the gate bus line 53L and the data bus line 51L defines a pixel electrode 57, which is formed to be connected to the drain electrode 51D of the TFT. A black matrix 58 is formed so as to cover the TFT, the gate bus line 53L, and the data bus line 51L. Here, the black matrix 58 overlaps the edge of the pixel electrode 57 so as to prevent light leakage through the areas between the pixel electrode 57 and the data bus line 51L and between the pixel electrode 57 and the TFT. A transparent planarization layer (not shown) is formed on the pixel electrode 57 as will be described below.

The second embodiment has vertical structures shown in FIGS. 5B and 5C. As shown in FIGS. 5B and 5C, the gate electrode 53G is placed on a substrate 50 in the area where the TFT is being formed. The gate insulating layer 52 covers the gate electrode 53G. An active layer 55 having an island shape is formed of amorphous silicon on the gate insulating layer 52. An ohmic contact layer 54 is formed on the active layer 55. The pixel electrode 57 is formed on a portion of the gate insulating layer 52, which is not covered by the active layer 55 and the ohmic contact layer 54. Source and drain electrodes 51S and 51D of aluminum or chrome are formed to be in contact with the ohmic contact layer 54. Here, the drain electrode 51D is connected to the pixel electrode 57. A protective layer 56 is located on the source electrode 51S, the drain electrode 51D, the exposed portion of the active layer 55, and pixel electrode 57. A black matrix resin 58 of an opaque insulating resin is formed on the protective layer 56 so as to cover the TFT and a portion of the pixel electrode 57.

At the side of the black matrix resin 58, a transparent planarization layer 59 of a transparent insulating resin is formed to reduce the step height near the boundary between the black matrix resin 58 and the pixel electrode 57. If an organic resin having negative photosensitive characteristics is used for the transparent insulating resin forming the transparent planarization layer 59, the process can be simplified.

As shown in FIG. 5C, which is a cross-sectional view taken along line VI—VI of FIG. 5A, the gate insulating layer 52 is formed on the substrate 50, and the pixel electrode 57 is formed thereon and spaced from data bus line 51L by a predetermined distance. The protective layer 56 is provided on the pixel electrode 57 and the data bus line 51L. The black matrix resin 58 of an opaque insulating resin is formed on the protective layer 56 to cover the data bus line 51L. Here, the black matrix resin 58 also covers a part of the pixel electrode 57 preventing light leakage through the area between the pixel electrode 57 and the data bus line 51L. A transparent planarization layer 59 is formed to reduce the step height near the boundary between the black matrix resin 58 and the pixel electrode 57.

Figure 6A:
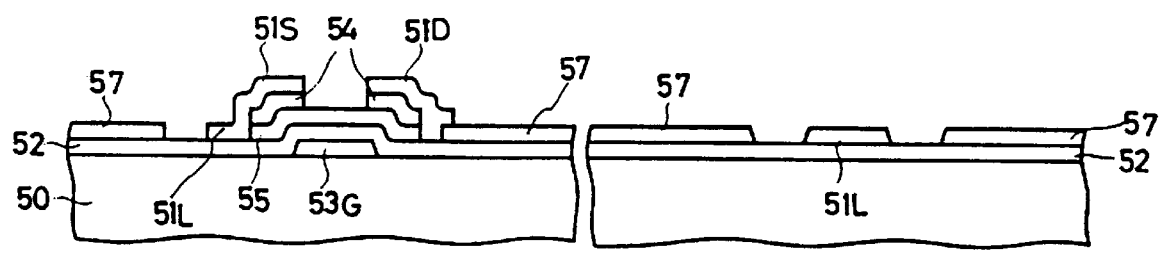
FIGS. 6A–6E are cross-sectional views for illustrating the manufacturing process of the TFT array substrate according to the second embodiment of the present invention.
Figure 6B:
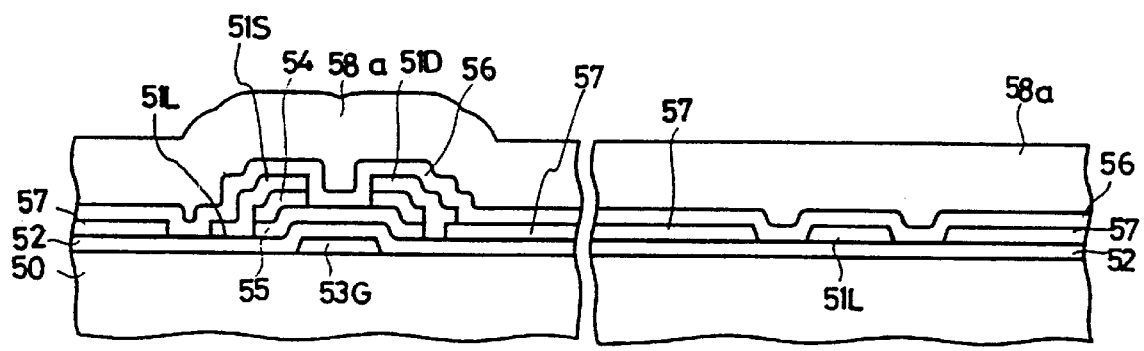

The second embodiment of TFT array substrate shown in FIGS. 5A, 5B, and 5C can be manufactured by the process illustrated in FIGS. 6A–6E. First, as shown in FIG. 6A, a metal such as chrome or aluminum is deposited on a substrate 50 by sputtering, for example, and patterned to form a gate electrode 53G together with a gate bus line (not shown). A silicon oxide layer or a silicon nitride layer is deposited over the substrate by CVD, for example, to form a gate insulating layer 52. Subsequently, amorphous silicon is deposited by CVD, for example, and patterned to form an active layer 55 over the gate electrode 53G. Then, impurity-doped amorphous silicon such as n+ a-Si is deposited over the substrate by CVD, for example, and patterned to form an ohmic contact layer 54 on the active layer 55. A transparent conductive material such as ITO is deposited over the substrate by sputtering, and patterned such that the transparent conductive material is removed at the TFT area and the data bus line area. This forms a pixel electrode 57. A metal material such as chrome is deposited over the substrate by sputtering and patterned to form a source electrode 51S and a drain electrode 51D. The exposed portion of the impurity-doped amorphous silicon over the channel region of the TFT is removed using the source electrode 51S and the drain electrode 51D as a mask. Here, the source electrode 51S extends from the data bus line 51L, and the drain electrode 51D contacts the pixel electrode 57. Accordingly, the TFT, the gate bus line, the data bus line, and the pixel electrode are formed. Additionally, a protective layer 56 is formed on the resultant structure of the substrate Next, as shown in FIG. 6B, an opaque insulating resin is coated over the substrate to form a resin layer 58a for the black matrix. Here, the resin layer is formed as thick as 1–2 μm in order to satisfy the light shielding requirement in consideration of the resin's light transmission characteristics.

Figure 6C:
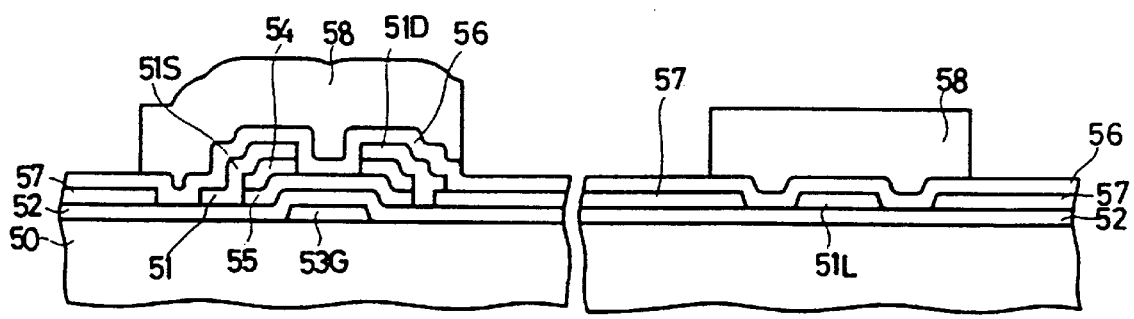

A photoresist (not shown) is coated on the resin layer 58a and patterned to cover the TFT and bus line areas. Using this photoresist pattern as a mask, the resin layer 58a is patterned to form the black matrix resin 58. Then, the photoresist pattern is removed (FIG. 6C). In this case, the resin layer 58a for the black matrix has no photosensitive characteristics. If the resin layer 58a has photosensitive characteristics, ultraviolet rays from the back of the substrate 50 can expose the resin layer 58a so that the resin layer 58a for the black matrix remains only on the TFT and base line areas.

Figure 6D:
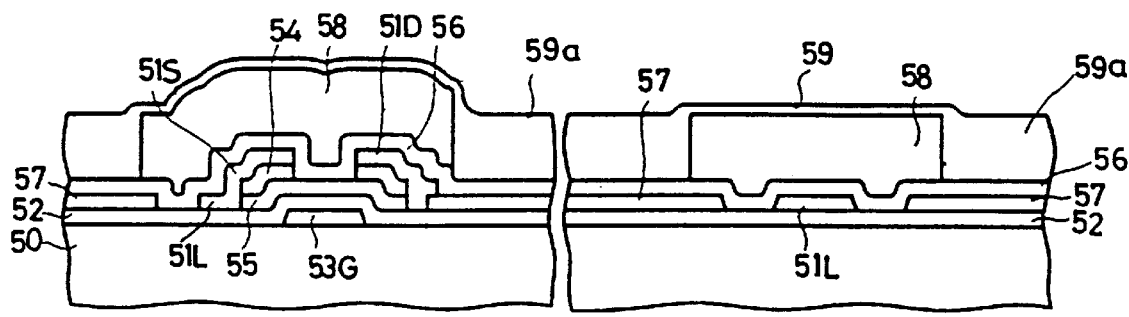

Referring to FIG. 6D, a transparent organic resin having negative photosensitive characteristics is deposited on a portion of the protective layer 56 that is not covered by the black matrix resin 58, and also on the black matrix resin 58, forming a resin layer 59a as a planarization layer. The resin layer 59a is exposed to an ultraviolet ray or a laser beam from the back of the substrate 50 and patterned. Here, if a transparent insulating layer having no photosensitive characteristics is used in place of the transparent organic resin having negative photosensitive characteristics, then a photoresist pattern is necessary to uncover the black matrix resin 58. Also, if a material having a large fluidity is used as the material for the resin layer 59a, the resin layer 59a can be made thin selectively on the black matrix resin 58. In this case, the removal of the resin layer 59a on the black matrix resin 58 may not be necessary.

Figure 6E:
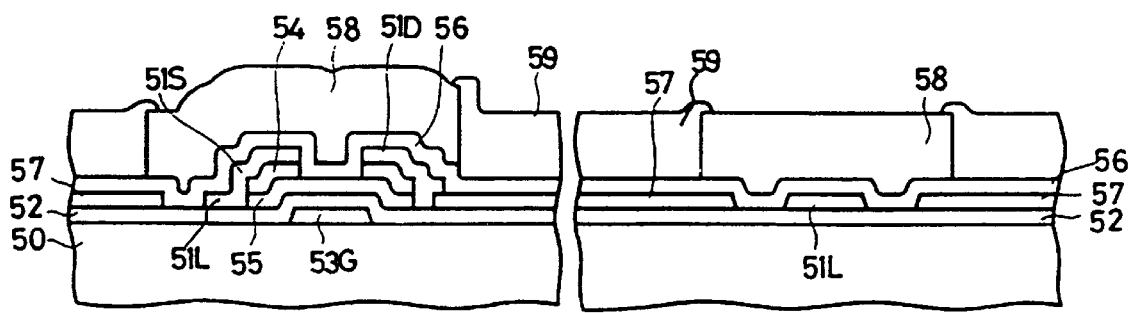

As shown in FIG. 6E, a portion of the resin layer 59a on the black matrix resin 58 is developed and removed to form a planarization layer 59 only on the pixel electrode 57. If the resin layer 59a has no photosensitive characteristics, the resin layer on the black matrix resin 58 can be removed using a photoresist pattern as discussed above.

As described above, the TFT array substrate according to the present invention is made such that a planarization layer is formed on the pixel electrode where the black matrix resin is not formed, to thereby obtain the planarization effect for the surfaces over the black matrix resin and the pixel electrode. As a result, such process as rubbing the orientation layer is facilitated, and liquid crystal is properly aligned, thereby enhancing the LCD characteristics.

It will be apparent to those skilled in the art that various modifications and variations can be made in a TFT array substrate and its fabrication method of the present invention without departing from the spirit or scope of the invention. Thus, it is intended that the present invention cover the modifications and variations of this invention provided they come within the scope of the appended claims and their equivalents.

What is claimed is:

1. A method of fabricating an LCD having a substrate, the method comprising the steps of:

forming a transistor having a gate, a source, and a drain over the substrate;

forming a light shielding layer over the transistor;

forming a transparent insulating layer at sides of the light shielding layer; and forming a pixel electrode connected to one of the source and the drain of the transistor, wherein the transparent insulating layer is formed to have an upper surface at a substantially same level as an upper surface of the light shielding layer.

2. The method according to claim 1, wherein the transistor forming step includes:

forming a gate line connected to the gate of the transistor over the substrate; and forming a data line connected to one of the source and the drain of the transistor over the substrate, wherein the light shielding layer is formed over a portion of at least one of the gate line and the data line in the step of forming the light shielding layer.

3. The method according to claim 2, further comprising between the transistor forming step and the light shielding layer forming step, the step of forming a protective layer over the transistor.

4. The method according to claim 2, wherein the substrate is transparent and has a back side and a front side, the transistor being formed at the front side of the substrate, and the transparent insulating layer forming step including the steps of:

forming a transparent insulating resin having negative photosensitive characteristics;

exposing a portion of the transparent insulating resin by an ultraviolet ray through the back side of the substrate; and removing the non-exposed portion of the transparent insulating resin to form the transparent insulating layer.

5. The method according to claim 4, further comprising between the transistor forming step and the light shielding layer forming step, the step of forming a protective layer over the transistor.

6. The method according to claim 2, wherein the pixel electrode is formed over the transparent insulating layer in the pixel electrode forming step, the gate line is formed under the transparent insulating layer in the gate line forming step, the data line is formed under the transparent insulating layer in the date line forming step, and the pixel electrode overlaps at least one of the light shielding layer, the gate line, and the date line in the pixel electrode forming step.

7. A method of fabricating an LCD having a substrate, the method comprising the steps of:

forming a transistor having a gate, a source, and a drain over the substrate;

forming a pixel electrode connected to one of the source and the drain of the transistor;

forming a protective layer over the transistor and the pixel electrode;

forming a light shielding layer over the transistor; and forming a transparent insulating layer at sides of the light shielding layer over the pixel electrode.

8. The method according to claim 7, wherein the transistor forming step includes:

forming a gate line connected to the gate of the transistor over the substrate; and forming a data line connected to one of the source and the drain of the transistor over the substrate, wherein the light shielding layer overlaps a portion of at least one of the gate line and the data line in the step of forming the light shielding layer.

9. The method according to claim 8, wherein the substrate is transparent and has a back side and a front side, the transistor being formed at the front side of the substrate, and the transparent insulating layer forming step including the steps of:

forming a transparent insulating resin having negative photosensitive characteristics;

exposing a portion of the transparent insulating resin by an ultraviolet ray through the back side of the substrate; and removing the non-exposed portion of the transparent insulating resin to form the transparent insulating layer.

10. A method of fabricating an LCD having a substrate, comprising the steps of:

forming a transistor having a gate, a source, and a drain over the substrate;

forming a protective layer over the transistor;

forming a light shielding layer over the protective layer, the light shielding layer having a substantially same pattern as that of the protective layer;

forming a transparent insulating layer at sides of the light shielding layer, the transparent insulating layer having a substantially consistent thickness, an upper surface of the light shielding layer and an upper surface of the transparent insulating layer being at a substantially same level; and forming a pixel electrode connected to one of the source and the drain of the transistor.

11. The method according to claim 10, wherein the step of forming transparent insulating layer includes the step of forming a transparent insulating organic resin.

12. The method according to claim 10, wherein the step of forming the transparent insulating layer includes the step of forming the transparent insulating layer that has negative photosensitive characteristics.

13. The method according to claim 10, wherein the step of forming the pixel electrode includes the step of forming the pixel electrode that is located over the transparent insulating layer and partially overlaps the light shielding layer.

14. The method according to claim 10, wherein the step of forming the transparent insulating layer includes the step of forming the transparent insulating layer that partially covers the light shielding layer.

15. A method of fabricating an LCD having a substrate, comprising the steps of:

forming a transistor having a gate, a source, and a drain over the substrate;

forming a gate line over the substrate connected to the gate of the transistor;

forming a data line over the substrate connected to one of the drain and source of the transistor;

forming a protective layer over the transistor, the gate line, and the data line, the protective layer having a substantially same pattern as those of the transistor, the gate line, and the data line;

forming a light shielding layer over the protective layer, the light shielding layer having a substantially same pattern as that of the protective layer;

forming a transparent insulating layer at sides of the light shielding layer, the transparent insulating layer having a substantially consistent thickness, an upper surface of the light shielding layer and an upper surface of the transparent insulating layer being at a substantially same level; and forming a pixel electrode over the transparent insulating layer, the pixel electrode being connected to one of the source and the drain of the transistor.

16. The method according to claim 15, wherein the step of forming the transparent insulating layer includes the step of forming a transparent insulating organic resin.

17. The method according to claim 15, wherein the step of forming the transparent insulating layer includes the step of forming the transparent insulating layer that has negative photosensitive characteristics.

18. The method according to claim 15, wherein the step of forming the pixel electrode includes the step of forming the pixel electrode that overlaps the light shielding layer.

19. The method according to claim 15, wherein the step of forming the pixel electrode includes the step of forming the pixel electrode that overlaps at least one of the data line and the gate line.

* * * * *